(12) United States Patent
Ushijima

(10) Patent No.: US 6,602,446 B2
(45) Date of Patent: *Aug. 5, 2003

(54) ELECTRICALLY CONDUCTIVE PASTE AND METHOD OF FORMING CIRCUIT

(75) Inventor: Hitoshi Ushijima, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 122 days.

This patent is subject to a terminal disclaimer.

(21) Appl. No.: 09/725,864

(22) Filed: Nov. 30, 2000

(65) Prior Publication Data

US 2001/0005936 A1 Jul. 5, 2001

(30) Foreign Application Priority Data

Nov. 30, 1999 (JP) .......................................... P.11-340373

(51) Int. Cl.[7] .............................. H01B 1/02; B05D 5/12
(52) U.S. Cl. .................... 252/512; 252/519.33; 427/96; 427/493; 427/543; 427/591
(58) Field of Search .................... 427/493, 532, 427/543, 591, 58, 96, 197, 205; 252/512, 513, 514, 519.33, 520.3, 521.2

(56) References Cited

U.S. PATENT DOCUMENTS

| | | | | |
|---|---|---|---|---|
| 5,428,506 A | * | 6/1995 | Brown et al. | 361/794 |
| 6,054,175 A | * | 4/2000 | Akiha et al. | 427/123 |

FOREIGN PATENT DOCUMENTS

| | | | | |
|---|---|---|---|---|
| EP | 0 359 709 | | 9/1989 | |
| JP | 62-132983 | | 6/1987 | C09J/3/00 |
| JP | 9823 | * | 1/1991 | |
| JP | 11265 | * | 1/1993 | |
| JP | 6-104565 | | 4/1994 | H05K/3/38 |
| JP | 345748 | * | 12/1999 | |
| JP | 203463 | * | 7/2001 | |

OTHER PUBLICATIONS

Patent Abstract of Japan, 06–104565, Apr. 15, 1994.

* cited by examiner

*Primary Examiner*—Brian K. Talbot
(74) *Attorney, Agent, or Firm*—Sughrue Mion, PLLC

(57) ABSTRACT

An electrically conductive paste is provided in that complexes A each made up of an electrically conductive filler 1 and a heating element 3 adapted to generate heat on electromagnetic induction are compounded with a resin 5.

2 Claims, 2 Drawing Sheets

ELECTRICALLY CONDUCTIVE PASTE AND METHOD OF FORMING CIRCUIT

BACKGROUND OF INVENTION

1. Field of Invention

The present invention relates to electrically conductive paste used in the manufacture of a printed circuit board or the like and a method of forming a circuit formed by the electrically conductive paste.

2. Field of Invention

As a method of manufacturing a printed circuit board, a method is known in which, as shown in FIG. 4, so-called electrically conductive paste 10 in which an electrically conductive filler such as copper, aluminum, and carbon black is dispersed in a thermoplastic resin or a thermosetting resin is coated on an insulating substrate 11 along a predetermined circuit pattern, and this insulating substrate 11 is placed in a heating oven 12 and is heated at a predetermined temperature so as to cure the conductive paste 10.

According to this method, it is an essential requirement for the insulating substrate 11 to withstand the curing temperature of the conductive paste 10. For example, in the case of copper phenolic conductive paste which is representative as this type of conductive paste 10, it is the common practice to effect heating at 160° C. for 20 minutes or thereabouts, and as the insulating substrate 11 it is necessary to use a material capable of withstanding such heating. For this reason, a resin whose softening point is lower than the aforementioned heating temperature, such as polyethylene or polypropylene, cannot be used as the material of the insulating substrate 11, and therefore there is a restriction in design. In addition, even the insulating substrate 11 formed of a resin other than polyethylene or polypropylene has some expansion or shrinkage due to heating, so that the situation is such that the deformation of the insulating substrate 11 is unavoidable.

Accordingly, it is practiced to prevent the deformation of the insulating substrate 11 by making the thermal stress of the insulating substrate 11 small by heating only the circuit pattern formed by the conductive paste 10 instead of heating the overall insulating substrate.

Specifically, a magnetic material together with a conductive filler is contained in the conductive paste 10, and a circuit pattern is formed on the insulating substrate 11 by using this conductive paste 10. A magnetic field is caused to act in the circuit pattern by a high-frequency induction coil or the like so as to cause the magnetic material in the conductive paste 10 to generate heat, and the resin is cured by this heat, thereby forming the circuit. According to this high-frequency induction heating, as for the insulating material 11, since only the portion coated with the conductive paste 10 is heated, it is possible to make the deformation of the insulating substrate remarkably small as compared with the aforementioned heating by the oven.

In addition, a high-frequency induction heating-type adhesive agent in which magnetic metal chopped fibers and metal powder are dispersed in a resin is disclosed in JP-A-6-35570 as the conductive paste 10 suitable for such electromagnetic induction.

However, in the case of the conventional high-frequency induction heating-type conductive paste, since the conductive filler and heating elements (magnetic material) are formed separately, the heating elements between themselves and the heating elements and the conductive filler are separated by the resin, so that the heat from the heating element is difficult to be transmitted. For this reason, it is necessary to adopt a measure such as making the output of the high-frequency induction coil large or making the heating time longer, so that the manufacturing cost increases.

In addition, in a case where the conductive filler and the heating elements are poorly dispersed in the conductive paste, unevenness of curing occurs in the conductive paste, and the quality of the circuit obtained is low.

The invention has been devised in view of the above-described circumstances, and its object is to provide electrically conductive paste whose heat generating efficiency in high-frequency induction heating is high, which permits curing with small energy, and which is free from the unevenness of curing, as well as a method of forming a circuit which is of high quality and has high reliability at low cost by using the conductive paste.

SUMMARY OF INVENTION

To attain the above object, electrically conductive paste in accordance with the invention is provided in that complexes each made up of an electrically conductive filler and a heating element adapted to generate heat on electromagnetic induction are compounded with a resin.

In addition, to attain a similar object, a method of forming a circuit in accordance with the invention is provided in that a circuit pattern formed by electrically conductive paste in which complexes each made up of an electrically conductive filler and a heating element adapted to generate heat on electromagnetic induction are compounded with a resin is cured by electromagnetic induction.

DETAILED DESCRIPTION OF PREFERRED EMBODIMENTS

Figure 1A:
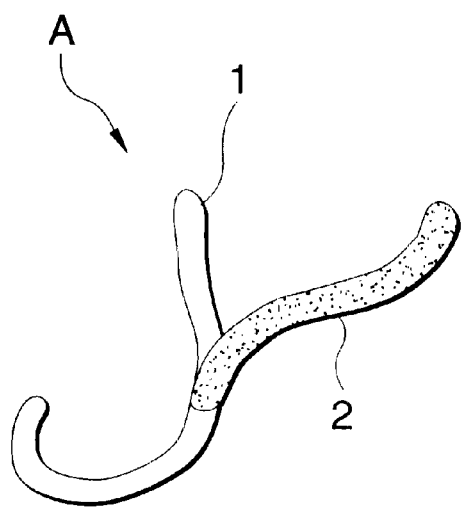
FIGS. 1(A) and (B) are diagrams schematically illustrating the appearance of a complex contained in electrically conductive paste of the invention.

Referring now to the drawings, a detailed description will be given of the invention.

In the electrically conductive paste of the invention, as an electrically conductive filler and heating elements for generating heat by electromagnetic induction, it is possible to use those which are conventionally used for this type of electrically conductive paste by appropriately selecting them.

As the material for forming the conductive filler, it is possible to cite, for example, copper, silver, gold, and the like. Meanwhile, as the material for forming the heating elements, it is possible to cite, for example, iron, ferrite, stainless steel, nickel, aluminum, and the like.

In addition, as for both the conductive filler and the heating element, their shapes are preferably granular, fibrous, whiskery, dendritic, or flaky.

Then, the conductive filler and the heating element are complexed and are dispersed in a resin in the form of complexes, and this dispersion is used as the conductive paste of the invention.

The combination of the conductive filler and the heating element is arbitrary. Further, a plurality of heating elements may be complexed with one conductive filler, or one heating element may be complexed with a plurality of conductive fillers.

In addition, the shape of the complex is not limited, and the aforementioned shapes may be combined in any way, but if at least one of the conductive filler and the heating element is fibrous, whiskery, or dendritic, the complexes in the conductive paste are entangled with each other, so that satisfactory heat transfer is effected. Namely, since the conductive filler is a metal, the conductive filler itself has a high coefficient of thermal conductivity, and satisfactorily transfers heat from the heating element to other entangled complexes, so that the coefficient of thermal conductivity of the conductive paste as a whole becomes higher than the conventional conductive paste, and the unevenness of heat transfer becomes small.

Figure 1B:
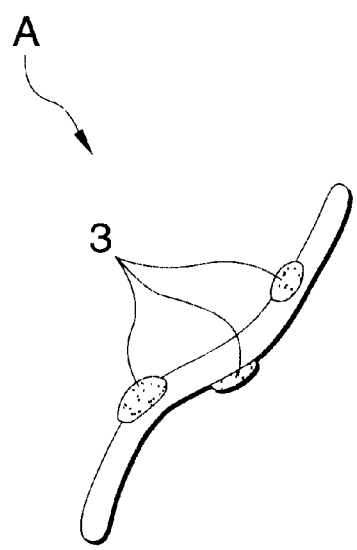

As a particularly preferable combination of the conductive filler and the heating element, it is possible to cite, for example, a complex A in which a copper whisker 1, which is a conductive filler, and an iron whisker 2, which is a heating element, are combined as shown in FIG. 1A, and a complex A in which iron particles 3 are attached to the surface of the copper whisker 1 as shown in FIG. 1B. Further, a complex in which nickel is used as the heating element is also preferable.

In addition, the ratio between the conductive filler and the heating element is not particularly restricted, and is appropriately selected in correspondence with their respective kinds, shapes, and the like.

The method of complexing the conductive filler and the heating element is not particularly restricted, and various methods are possible.

For example, the material for the conductive filler, the material for the heating elements, and a reducing agent such as carbon powder are sufficiently mixed, and this mixture is placed in a ceramic boat, is disposed in an electric furnace, and is caused to react in an atmosphere of an inert gas at 400 to 800° C. for 1 to 10 hours while introducing steam and, if necessary, hydrogen gas into it. Consequently, it is possible to obtain complexes in each of which particles of the heating element are attached to the surface of the whiskery conductive filler.

In addition, the resin for dispersing the aforementioned complexes is not particularly restricted, either, and may be appropriately selected from among thermoplastic resins and thermosetting resins which are conventionally used for this type of conductive paste. For example, it is possible to use general acrylic resin, urethane resin, epoxy resin, phenolic resin, and the like.

The compounding ratio between the complexes and the resin is not particularly restricted, but is preferably set to 10 to 1000 parts by weight of the complexes with respect to 100 parts by weight of the resin. If the amount of the complexes is smaller than the aforementioned amount of compounding, faulty curing of the conductive paste due to the small amount of the heating element and faulty electric conduction due to the small amount of the conductive filler, and the like can result. On the other hand, if the amount of the complexes exceeds the aforementioned amount of compounding, the amount of the resin becomes relatively small, so that coating properties at the time of formation of the circuit pattern, the shape retaining property of the circuit pattern, and the adhesiveness with respect to the insulating substrate become deteriorated.

Still further, a plurality of kinds of complexes may be used by being mixed.

Figure 2:
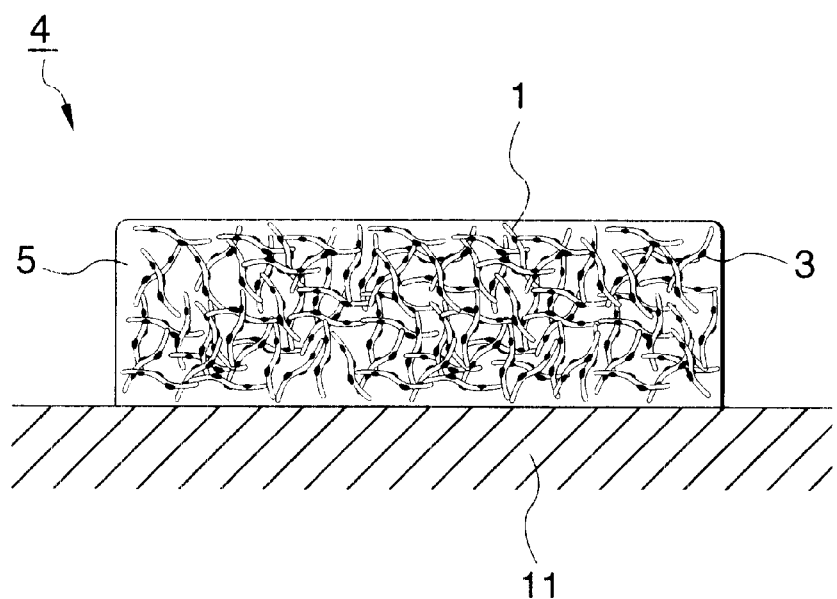
FIG. 2 is a schematic diagram illustrating a cross section of a circuit pattern formed of the electrically conductive paste of the invention.

FIG. 2 is a schematic diagram illustrating a cross section of a circuit pattern 4 consisting of the electrically conductive paste of the invention. In this circuit pattern, the complexes each made up by the copper whisker 1 and the iron particles 3, as shown in FIG. 1B, are entangled with each other and are uniformly dispersed in a resin 5. Accordingly, at the time of the formation of the circuit which will be described later, the heat from the iron particles 3 which constitute the heating elements is satisfactorily transferred to the other entangled complexes through the copper whisker 1. Therefore, the thermal conductivity of the conductive paste as a whole is enhanced, with the result that the circuit pattern 4 can be cured without causing the unevenness of curing even with small energy.

It should be noted that reference numeral 11 in the drawing denotes an insulating substrate.

Figure 3:
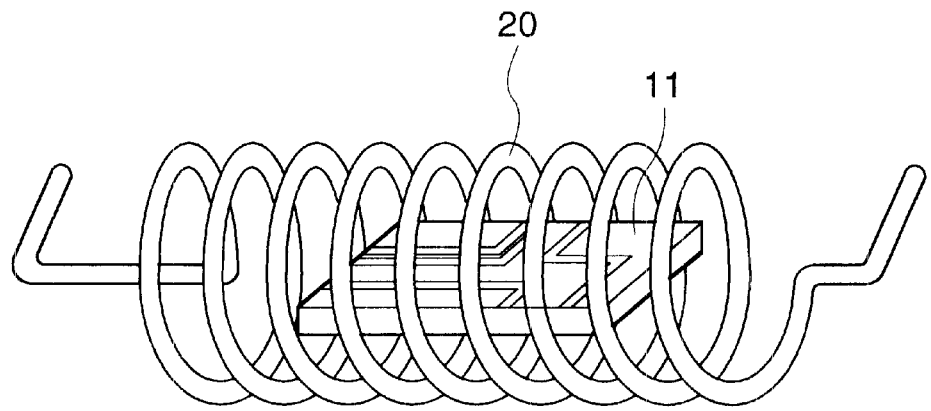
FIG. 3 is a perspective view illustrating an example of a high-frequency induction coil used for forming the circuit pattern in the invention.
Figure 4:
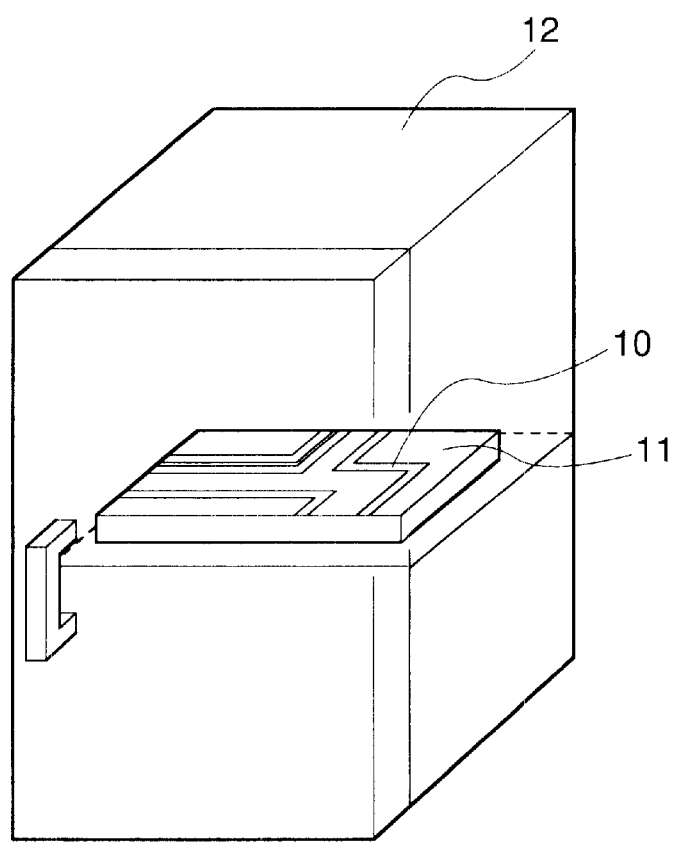
FIG. 4 is a schematic diagram for explaining a conventional method of forming a circuit pattern.

In forming the circuit pattern such as a printed circuit board or the like by using the conductive paste of the invention, it is possible to comply with a conventional high-frequency induction heating method. Namely, the insulating substrate 11 with the predetermined circuit pattern 4 formed thereon by the conductive paste as described above is placed in a high-frequency induction coil 20 as shown in FIG. 3, and a high-frequency current is supplied to the high-frequency induction coil 20 from an unillustrated high-frequency power source to generate a magnetic field. The heating elements in the conductive paste are caused to generate heat due to the action of this magnetic field to allow the resin to cure.

The conditions such as the frequency and output of the high-frequency current and the heating time at this time are appropriately set in accordance with the kinds of the resin and the heating element for forming the conductive paste as well as the compounding ratio and the like. For example, the frequency may be set in the range of 1 k to 10 MHz, the output is set to a range of 10 kW or less, and the heating time is set to a range of 1 hour or less or thereabouts, but the conditions are not particularly limited the same.

EXAMPLES

Hereafter, a more detailed description will be given of the invention by citing examples. However, the invention should not be limited to the following examples.

Example 1

By using a ball mill, 1 mol of copper chloride, 0.1 mol of ferrous chloride, and 1 mol of carbon powder were mixed uniformly, and this mixture was placed in a ceramic boat, was placed in an electric furnace, and was caused to react at 400° C. for 1 hour in an atmosphere of nitrogen gas while introducing steam into it. As a result, it was possible to obtain complexes in which iron particles having diameters ranging from 5 to 10 $\mu$m were attached to the surfaces of copper whiskers having lengths ranging from 50 to 80 $\mu$m, as shown in FIG. 1B.

Next, these complexes were compounded with a phenolic resin at a ratio of 600 parts by weight of the complexes with respect to 100 parts by weight of the phenolic resin, and were mixed sufficiently, thereby fabricating the conductive paste.

Then, when after a circuit pattern was coated on the insulating substrate made of PET by using the conductive paste obtained, this insulating substrate was disposed in a high-frequency induction coil and was treated by a coil passing current of 80 A for 10 minutes to allow the conductive paste to cure, the deformation of the insulating material was nil, and the unevenness of curing was not observed in the conductive paste.

Comparative Example 1

With respect to 100 parts by weight of acrylic resin, 600 parts by weight of copper chopped fibers and 5 parts by weight of iron particles were compounded, and were mixed for the same time duration as in Example 1, thereby fabricating conductive paste.

Then, after a circuit pattern was coated on the insulating substrate made of PET by using the conductive paste obtained, this insulating substrate was subjected to high-frequency induction heating under conditions similar to those of Example 1 to cure the conductive paste. Although the deformation of the insulating material was not observed, slight unevenness of curing was noted in the conductive paste. Accordingly, when the output was increased to 100 A, and the heating time was extended to 20 minutes, the unevenness of the curing of the conductive paste disappeared.

From a comparison between Example 1 and Comparative Example 1 above, it can be appreciated that the treatment conditions of high-frequency induction heating can be alleviated by using the conductive paste of the invention, and that a high-quality circuit can be formed at low cost.

As described above, in accordance with the invention, it is possible to obtain conductive paste whose heat generating efficiency in high-frequency induction heating is high, which permits curing with small energy, and which is free from the unevenness of curing. In addition, it is possible to form a circuit which is of high quality and has high reliability at low cost by using the conductive paste of the invention.

What is claimed is:

1. An electrically conductive paste comprising:

complexes made up by mixing an electrically conductive filler and a heating element adapted to generate heat by electromagnetic induction, said heating element being securely connected to said conductive filler; and a resin mixed with the complexes.

2. A method of forming a circuit comprising the steps of:

mixing an electrically conductive filler and a heating element adapted to generate heat on electromagnetic induction to form complexes in which said heating element is securely connected to said conductive filler;

mixing the complexes with a resin to form electrically conductive paste to form a circuit pattern;

curing the circuit pattern by electromagnetic induction.

* * * * *